(12) United States Patent
Graumann (10) Patent No.: US 11,831,340 B2
(45) Date of Patent: Nov. 28, 2023

(54) BURST ERROR TOLERANT DECODER AND RELATED SYSTEMS, METHODS, AND DEVICES

(71) Applicant: Microchip Technology Incorporated, Chandler, AZ (US)

(72) Inventor: Peter Graumann, Calgery (CA)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 17/453,119

(22) Filed: Nov. 1, 2021

(65) Prior Publication Data
US 2022/0052710 A1 Feb. 17, 2022

Related U.S. Application Data (62) Division of application No. 16/283,634, filed on Feb. 22, 2019, now Pat. No. 11,165,443.

(Continued)

(51) Int. Cl.
H03M 13/29 (2006.01)
H03M 13/17 (2006.01)
G06F 11/10 (2006.01)

(52) U.S. Cl.
CPC ..... H03M 13/2906 (2013.01); G06F 11/1076 (2013.01); H03M 13/17 (2013.01)

(58) Field of Classification Search
CPC H03M 13/2906; H03M 13/17; G06F 11/1076
See application file for complete search history.

(56) References Cited

U.S. PATENT DOCUMENTS

| 5,121,395 A | 6/1992 | Millar |
| 8,553,821 B1 | 10/2013 | Eliaz |

(Continued)

FOREIGN PATENT DOCUMENTS

| CN | 101098552 A | 1/2008 |
| CN | 101621299 A | 1/2010 |
| CN | 105900354 A | 8/2016 |

OTHER PUBLICATIONS

Cunha et al., "Symbol-Wise Chase Decoding of q-ary Block Codes over BI-AWGN Channels", IEEE Communications Letters, IEEE Service Center, Piscataway, NJ, US, vol. 15, No. 2, Feb. 1, 2011, pp. 229-231, XP011345759.

(Continued)

Primary Examiner — Guy J Lamarre
(74) Attorney, Agent, or Firm — TraskBritt (57) ABSTRACT

Disclosed embodiments of the present disclosure relate, generally, to systems, methods, and devices for correction of burst-errors induced during transmission of encoded blocks of information. Some embodiments relate to decoders configured to test candidate corrections on a received block of information and select a candidate correction that best fits the characteristics of burst-errors expected for a type of transmission scheme. Such tested candidate corrections may be selected based on characteristics of burst-errors typically induced for a type of transmission scheme. Some embodiments relate to decoders configured to test candidate corrections for correcting burst-errors and perform standard error correcting techniques such as Reed-Solomon forward error correction techniques. Some embodiments relate to systems, such as serial/deserializer interfaces, that incorporate such decoders.

7 Claims, 8 Drawing Sheets

Related U.S. Application Data (60) Provisional application No. 62/739,744, filed on Oct. 1, 2018.

(56) References Cited

U.S. PATENT DOCUMENTS

| | | | |
|---|---|---|---|
| 8,566,687 | B1 | 10/2013 | Eliaz |
| 8,571,146 | B1 | 10/2013 | Eliaz |
| 9,258,155 | B1 | 2/2016 | Riani et al. |
| 2006/0190799 | A1 | 8/2006 | Kan et al. |
| 2008/0052597 | A1* | 2/2008 | Valliappan .......... H03M 13/175 714/762 |
| 2008/0082896 | A1* | 4/2008 | Valliappan .......... H03M 13/175 714/E11.021 |
| 2009/0187807 | A1 | 7/2009 | Narasimha et al. |
| 2010/0031120 | A1 | 2/2010 | Belogolovy et al. |
| 2011/0131469 | A1 | 6/2011 | Geng et al. |
| 2014/0245104 | A1 | 8/2014 | Song et al. |
| 2014/0317466 | A1 | 10/2014 | Kato |
| 2015/0124912 | A1 | 5/2015 | Eliaz et al. |
| 2015/0131512 | A1 | 5/2015 | Lauer et al. |
| 2016/0094861 | A1 | 3/2016 | Caron et al. |
| 2017/0262567 | A1 | 9/2017 | Vassiliev |
| 2018/0226994 | A1 | 8/2018 | Brueggen et al. |
| 2018/0358986 | A1 | 12/2018 | Santhanam et al. |
| 2018/0365021 | A1 | 12/2018 | Chen et al. |
| 2020/0021833 | A1 | 1/2020 | Xu et al. |
| 2020/0244288 | A1 | 7/2020 | Noh et al. |

OTHER PUBLICATIONS

International Search Report for International Application No. PCT/US2019/053597, dated Jan. 7, 2020 4pages.

International Written Opinion for International Application No. PCT/US2019/053597, dated Jan. 7, 2020, 9 pages.

Leroux et al., "Stochastic Chase Decoding of Reed-Solomon Codes", IEEE Communications Letters, IEEE Service Center, Piscataway, NJ, US, vol. 14, No. 9, Sep. 1, 2010, pp. 863-865, XP011317205.

Mani et al., "Symbolic Stochastic Chase Decoding of Reed-Solomon and BCH Codes", IEEE Transactions on Communications, ARVIX.org, Cornell University Library, 201 Olin Library Cornell University Ithaca, NY 14853, Jul. 14, 2017, XP080776689.

Park et al. "Error-Pattern-Correction Cyclic Codes Tailored to a Prescribed Set of Error Cluster Patterns", IEEE Transactions on Information Theory, IEEE Press, USA, vol. 55, No. 4, Apr. 1, 2009, pp. 1747-1765, XP011253796.

Chinese First Office Action and Search Report for Chinese Application No. 201980064885.2, dated Aug. 1, 2023, 48 pages with translation.

Heloir, R. et al., Stochastic chase decoder for reed-solomon codes, 10th IEEE International NEWCAS Conference, (2012), pp. 5-8, doi: 10.1109/newcas.2012.6328942.

* cited by examiner

FIGURE 6
(state of the art)

BURST ERROR TOLERANT DECODER AND RELATED SYSTEMS, METHODS, AND DEVICES

CROSS-REFERENCE TO RELATED APPLICATIONS

This application is a divisional of U.S. patent application Ser. No. 16/283,634, filed Feb. 22, 2019, now U.S. Pat. No. 11,165,443, issued Nov. 2, 2021, which claims the benefit under 35 U.S.C. § 119(e) of U.S. Provisional Patent Application Ser. No. 62/739,744 filed Oct. 1, 2018, the entire contents and disclosure of each of which is hereby incorporated herein by this reference.

TECHNICAL FIELD

Embodiments of the present disclosure relate generally to serial communication and, more specifically, to errors introduced during communication over a serial communication channel and to correction of those errors.

BACKGROUND

In many embedded systems, and other computing systems, movement of data between peripheral devices and a host, or between peripheral devices, may be a significant amount of data traffic on the various buses that may exist in such systems. As data moves through these systems, sometimes it moves in parallel (i.e., multiple bits are conveyed simultaneously) and other times it moves serially (i.e., one bit is conveyed at a time).

In conventional inter-system communication, a serializer-deserializer ("SerDes") is often used at an interface between parallel and serial communication channels. In a typical arrangement, a SerDes transmitter will generate a sequence of logical 1s and 0s based on input data, convert those to analog values (e.g., +0.5 V and −0.5 V, without limitation), shape the analog signal based on the medium used for the serial communication channel (e.g., copper wire, printed-circuit-board traces, and cables, without limitation), increase a parallel clock to a frequency of the serial communication channel, and transmit the data out over the serial communication channel. The SerDes receiver receives serial data from the serial communication channel, slows the data to match the frequency of the parallel communication channel, and then transmits the data over the parallel communication channel.

Conventional inter-system communication architectures assume little to no bit-errors at these interfaces, however, the inventors of this disclosure appreciate that, especially at high speed transmission rates, such assumptions do not hold true. Thus, the inventors of this disclosure appreciate a need for robust error correction within communication systems that can addresses at least some of these errors.

BRIEF DESCRIPTION OF THE DRAWINGS

While this disclosure concludes with claims particularly pointing out and distinctly claiming specific embodiments, various features, benefits, and/or advantages of embodiments of the disclosure will be apparent to those of ordinary skill in the art from the following detailed description and the accompanying drawings, in which:

DETAILED DESCRIPTION

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

It will be readily understood that the components of the embodiments as generally described herein and illustrated in the drawings may be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

The following description may include examples to help enable one of ordinary skill in the art to practice the disclosed embodiments. The use of the terms "exemplary," "by example," "for example," "e.g.," and the like means that the related description is explanatory, and though the scope of the disclosure is intended to encompass the examples and legal equivalents, the use of such terms is not intended to limit the scope of an embodiment or this disclosure to the specified components, steps, features, functions, or the like.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

It should be understood that any reference to an element herein using a designation such as "first," "second," and so forth does not limit the quantity or order of those elements, unless such limitation is explicitly stated. Rather, these designations are used herein as a convenient method of distinguishing between two or more elements or instances of an element. Thus, a reference to first and second elements does not mean that only two elements can be employed or that the first element must precede the second element in some manner. Also, unless stated otherwise, a set of elements may comprise one or more elements. Likewise, sometimes elements referred to in the singular form may also include one or more instances of the element.

Those of ordinary skill in the art would understand that information and signals described herein may be represented using any of a variety of different technologies and techniques. For example, data, instructions, commands, information, signals, bits, and symbols that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein.

A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration.

A general-purpose processor may be part of a general-purpose computer, which should be considered a special-purpose computer when configured to execute instructions (e.g., software code) for carrying out embodiments of the present disclosure. Moreover, when configured according to embodiments of the present disclosure, such a special-purpose computer improves the function of a general-purpose computer because, absent the present disclosure, the general-purpose computer would not be able to carry out the processes of the present disclosure. The present disclosure also provides meaningful limitations in one or more particular technical environments that go beyond an abstract idea. For example, embodiments of the present disclosure provide improvements in the technical fields of inter-system communication and error correction.

Also, it is noted that the embodiments may be described in terms of a process that is depicted as a flowchart, a flow diagram, a structure diagram, or a block diagram. Although a flowchart may describe operational acts as a sequential process, many of these acts may be performed in another sequence, in parallel, or substantially concurrently. In addition, the order of the acts may be re-arranged. A process may correspond to a method, a thread, a function, a procedure, a subroutine, and a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any characterization in this disclosure of something as "typical," "conventional," or "known" does not necessarily mean that it is disclosed in the prior art or that the discussed aspects are appreciated in the prior art. Nor does it necessarily mean that, in the relevant field, it is widely known, well-understood, or routinely used.

As used herein, "bit-error" means a received digital bit of information that is different than a corresponding transmitted bit.

As used herein, "symbol" and "symbols" mean a unit of information that is represented by one or more bits. For example, a particular communication system may transfer symbols, and each symbol may be represented by m-bits (i.e., m contiguous bits). Symbols may be, for example, human readable, computer readable (e.g., encoded), and combinations thereof, without limitation. An example of a symbol used with disclosed embodiments is a Reed-Solomon symbol (also commonly referred to as a "Reed Solomon code").

As used herein, "symbol error" means that a received symbol is different than a user symbol (i.e., a transmitted symbol). One example of a symbol error is given an m-bit symbol, the symbol contains anywhere from 1 to m bit-errors.

As used herein, "burst-error" means two or more bit-errors in sequence. It is not necessary that all of the bits within a burst error actually constitute a bit-error. By way of example, a burst error may be a sequence of bits starting with a bit-error and ending with a final bit-error such that there are sufficient error-free bits after the final bit-error to "clear" a burst-error event. A burst-error event may be deemed cleared (i.e., there are no more bit errors in a sequence of bits associated with a burst error event) when there are no further bit errors in a sufficiently large window of past bits. By way of a more particular example, in the case of DFE induced burst errors, a burst-error event may be considered cleared when all of the bits within the DFE filter are correct, e.g., for a 4-tap DFE, 4 error-free bits after a final bit-error would be detected to determine that error propagation associated with the DFE has ended. This is illustrated in the following burst error example with a 4-tap DFE, where the strings are bit-error indications with the first to be received on the left. Double underlined part of the strings indicate the bit-errors and the single underlined part of the strings indicate error-free bits:

'... 01110000...': 3-bit burst cleared by 4 consecutive error-free bits. The error event in this example also happens to be contiguous though this is not a requirement.

'... 01010000...': 3-bit burst cleared by 4 consecutive error-free bits.

'... 0100010000...' 5-bit burst cleared by 4 consecutive error-free bits. The middle 3 error-free bits (between '1's) were not enough to clear the DFE of errors, it must wait for 4 bits.

Disclosed embodiments are not limited to systems that receive digital information represented using a binary system, and are applicable to systems that receive digital information represented by more than two levels of information. For example, one of ordinary skill in the art would understand that disclosed embodiments are adaptable to systems receive digital information represented using four levels of information, such as PAM4 sequences of digital information that are transmitted as bit pairs (i.e., two digital bits per transmission), where each bit pair represents a particular transmit voltage level; as well as PAM5, PAM8.

Typical SerDes interfaces known to inventors of this disclosure were able to generate an effectively error-free stream of digital information. However, at high transmission rates, bit-errors and consequently symbol errors are introduced in the information communicated across SerDes transmitters and receivers.

One cause of bit-error (and consequently, symbol error) is inter-symbol interference (ISI), which is a form of distortion of a signal in which one bit that is used to represent the information being communicated interferes with subsequent bits that represent the information being communicated.

Figure 6:
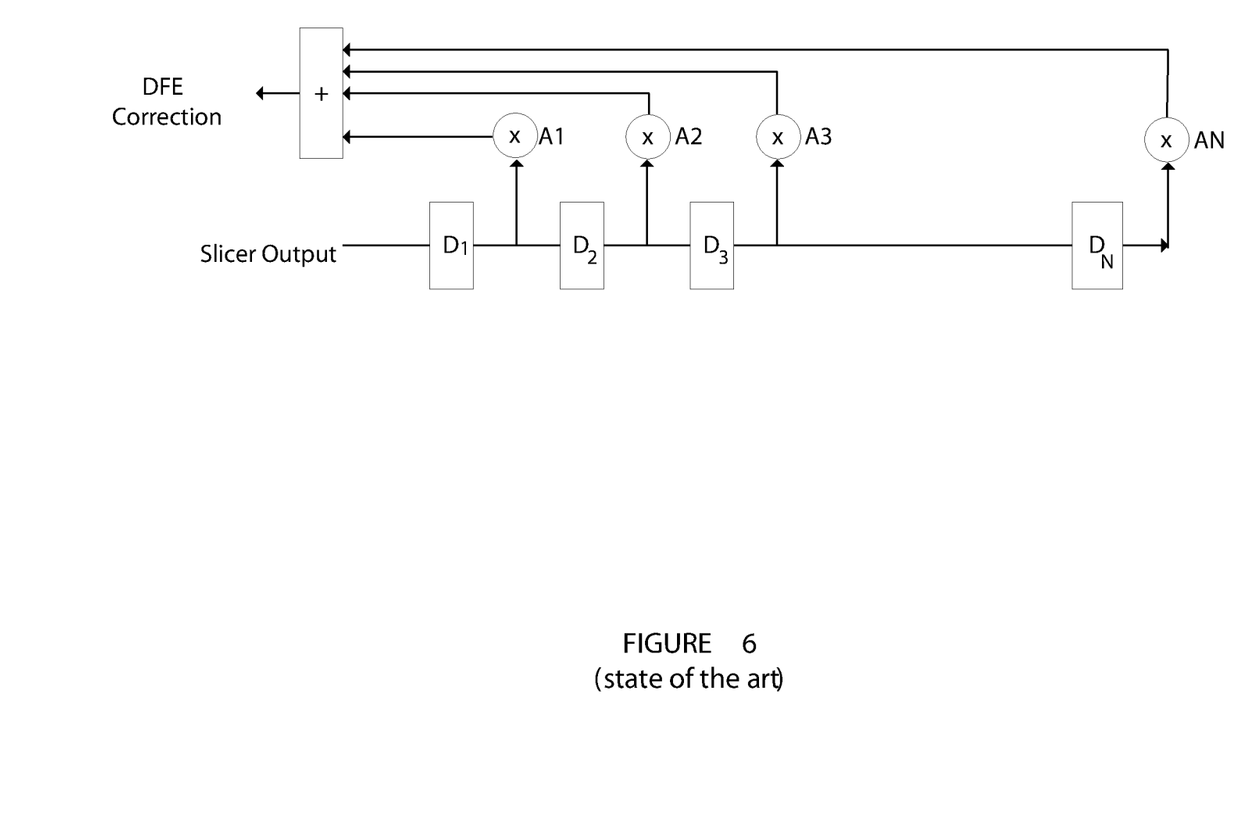
FIG. 6 shows a block diagram of a decision feedback equalization technique known to the inventors of this disclosure.

Some conventional communication systems employ a technique called Decision Feedback Equalization (DFE) to equalize the interference generated by a previously received bit on a currently received bit of information. FIG. 6 shows a block diagram of an example filter implementing a DFE technique known to the inventors of the disclosure, and that may be used in conjunction with one or more embodiments of this disclosure as further described herein. In the embodiment shown in FIG. 6, an input to a filter comes from a slicer output, which are 1s and 0s representing received digital information. The D1 to DN elements are standard D type flip-flop (DFF) elements where each flip-flop implements a delay of 1 clock cycle or a "User-Interval" (UI). A shift-register of such DFF elements implements a delay-line storing the previously received N values. By way of example, in a typical receiver, N may be any number from 1 to 15 with values in the range from 5 to 8 being most commonly used. At each point of the delay chain the value at that location is multiplied by a multiplier (i.e., a DFE multiply value) from A1 to AN, where DN is multiplied by AN to obtain a DFE correction for each tap of a filter. All of the weighted taps are summed together to obtain a DFE correction for a current symbol (D0 which will be a next slicer output).

One of ordinary skill in the art would understand that other DFE techniques may be used in conjunction with one or more embodiments, sometimes with minor modifications and adjustments for implementation.

ISI increases significantly as data transmission rates increase and/or transmission line lengths increase. Moreover, DFE assumes that all of the previous bits are correct. However, a decision error by a slicing element—e.g., selecting a logical 0 that should be a logical 1, and vice-versa—affects the equalization of subsequent bits, which can lead to further bit-errors. Thus, DFE is not able to achieve completely error-free transmission across all transmission rates and channels. Moreover, received bit errors may lead to erroneous bits in the DFE equalizer leading to further bit errors. A series of such errors where a first error event leads to further error events until a final error (after which bits are correct) is referred to as a burst error.

Some conventional communication systems employ Forward Error Correction (FEC) techniques in addition to DFE to correct bit-errors at a receiver that are not corrected by DFE. FEC techniques typically involve implementing a form of block encoding, such as BCH (Bose, Ray-Chaudhuri and Hocquenghem) or RS (Reed-Solomon), which are known to those having ordinary skill in the art to have burst-error correction capability. In a typical case, redundant data, such as parity symbols, are added to a message and used by a receiver to recover a message even when a number of errors were introduced during transmission (or storage). FEC can correct some bit-errors, however, block encoding techniques such as RS are limited to correcting t symbol errors in each n symbol FEC block, where 2t=p, and p is a number of parity symbols. So, for every two (2) parity symbols that are present in a FEC block, one randomly located symbol error may be located and corrected. In an n symbol FEC block, if a number of symbol errors is greater than t, then the given FEC block is beyond the correction capabilities of the standard decoding algorithm and an outputted "corrected" FEC block may still include errors.

Accordingly, burst errors, including those caused by DFE, can overwhelm the capability of conventional error correction techniques used for communication across transmission interfaces such as SerDes interfaces. Moreover, the rate and length of burst errors will increase with transmission rates, transmission line length, and quality of transmission lines. Block encoding techniques like RS utilize some parity symbols to locate symbol errors and other parity symbols are used to correct the symbol errors (i.e., replace with the correct user symbol).

Erasure decoding techniques for forward error correction typically involve using external information to locate symbol errors in a received transmission, and thus more symbols may be corrected using the same number of parity symbols as block encoding techniques like RS. Erasure is a process of indicating a location or locations in a block of information for information that is known to be in error and therefor may be erased. Erasure correction is a process of correcting those locations of the block of information that have been erased.

For example, a typical erasure process may include the operations of: (i) compute a Syndrome (a Syndrome is a result of performing an XOR operation of a parity symbol with transmitted data symbols); (ii) compute tau (tau is a polynomial derived from the known error locations); (iii) compute a Forney Modified Syndrome (FMS), which FMS combines tau with the computed Syndrome to create a combined Syndrome for the decode operation; (iv) compute an error location (e.g., using Berlekamp-Massey) and look for Q=(P−E)/2 errors—but if E=P then the erasure process may skip this step; (v) compute an Errata evaluator polynomial Omega and combine an error locator polynomial with FMS; (vi) find roots of the combination-here the erasure process is looking for Q roots, but if P=E then the erasure process may skip this step; (vii) compute an errata locator polynomial phi derived from the error locator polynomial and tau; and (viii) use Forney's method to compute the correction symbols for each error location. In the example above, 'P' is the number of parity symbols available in the FEC block. 'Q' is the number of randomly located errors that are corrected. 'E' is the number of erasure symbols that are corrected.

To use conventional erasure techniques with block encoding, an external indication is needed about which symbol or symbols are in error (e.g., location of symbol or symbols, without limitation), however, no such indication is available in SerDes interfaces, nor can it be easily added, due to power efficient analog architectures that are usually employed.

Accordingly, one or more embodiments of the disclosure relate, generally, to using erasure techniques with block encoding techniques such as RS for error correction. In one or more embodiments, all possible contiguous erasure patterns in an FEC block are attempted. More specifically, for each contiguous erasure pattern of the possible contiguous erasure patterns, the erasure symbols are in sequence according to the received ordering of bits forming an FEC block.

For each erasure pattern, a nominal correction mask is identified. After computing symbol erasure decodes for all of the possible erasure patterns, the results are compared to identify a correction pattern (i.e., a correction mask) that best matches the burst-error output of a SerDes interface. If other error correction possibilities are available (e.g., standard FEC using RS) then those results are compared to the results of using the identified correction pattern, and either the other error correction results or the results of using the identified correction pattern are selected based on the comparison.

Figure 1:
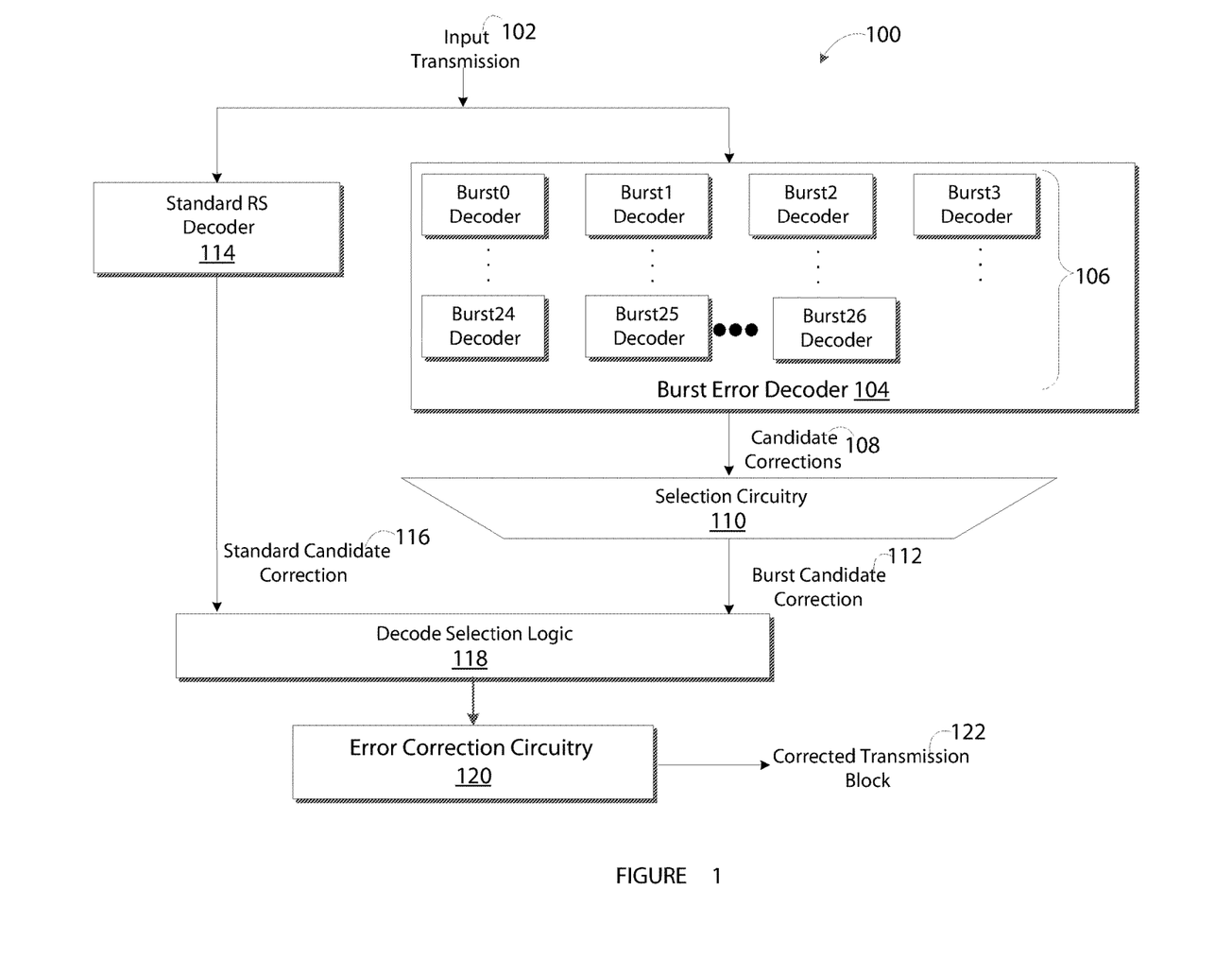
FIG. 1 shows a block diagram of a decoder that is burst-error tolerant, in accordance with one or more embodiments of the disclosure.

One or more embodiments of the disclosure relate, generally, to decoders that are burst error tolerant, and SerDes interfaces and receivers that incorporate the same. FIG. 1 shows block-diagram of a decoder 100 that is burst-error tolerant, in accordance with one or more embodiments of the disclosure. In one or more embodiments, decoder 100 includes standard RS decoder 114, burst error decoder 104, selection circuitry 110, and decode selection logic 118. One or more embodiments of decoder 100 may be implemented in hardware (e.g., circuits and electronic devices, without limitation), digital logic (e.g., combinational logic gates, without limitation), a finite state machine (e.g., combinational logic and flip-flops, without limitation), and combinations thereof.

In one or more embodiments, burst error decoder 104 is configured, generally, to try (i.e., test) all contiguous erasure patterns—referred to in this disclosure as "candidate erasure patterns," and each such erasure pattern referred to herein as a "candidate erasure pattern." One or more of the candidate erasure patterns may be performed in parallel by one or more burst decoder modules 106, labeled in FIG. 1 as burst decoders 1 to N. Each burst decoder module 106 is configured to implement one candidate erasure pattern of the candidate erasure patterns. In one or more embodiments, burst error decoder 104 is configured to output a candidate corrected transmission block 122 responsive to test error correcting using each candidate erasure pattern. Each such result of a burst decoder module 106 and subsequently output of burst error decoder 104 referred to herein as a "candidate correction 108."

In one or more embodiments, selection circuitry 110 is configured, generally, to receive all of the candidate corrections 108 from the burst error decoder 104 (i.e., all of the results from attempting the candidate erasure patterns), and select and output a burst candidate correction 112.

Selection circuitry 110 selects and outputs a burst candidate correction 112 by comparing candidate corrections 108 and selecting a candidate correction 108 that best "fits" a receiver, or SerDes interface more generally, that includes decoder 100. Selection circuitry 110 may include selection logic (not shown) for determining best fit based on the type of receiver, for example, selection circuitry 110 may include SerDes discrimination logic (not shown) that identifies a candidate correction 108 corresponding to a shortest burst error, for example, because SerDes receivers rarely experience long burst errors. In one embodiment, such discrimination logic may define scoring criteria for scoring each candidate correction 108 in terms of its suitability as a burst-error correction solution. For example, scoring criteria may include one or more of burst error length, weighting factors, groupings of burst errors, and more. Selection circuitry 110 may select a burst candidate correction 112 responsive to scoring criteria. In the case of weighting factors, scoring may be weighted in favor of corrections that are a better (or more useful) match for the kind of error prorogation that is expected for a given transmission scheme, in the case of SerDes receivers, DFE error propagation. In the case of DFE error propagation, contiguousness of a given correction pattern may be used, as well as information about specific tap weights of the DFE.

In one or more embodiments, candidate corrections 108 may be a binary mask referred to herein as a "correction mask," with a length that is equal to a number of parity symbols or bits of parity symbols. For example, if a transmission consists of 30 5-bit symbols (e.g., where there are 26 user symbols and 4 parity symbols), then the transmission consists of 150 bits (130-bits of user symbols and 20-bits of parity symbols), and so candidate correction masks have a 20-bit length.

Notably, given that 'P=E' resulting burst decoder logic of disclosed embodiments is area efficient, requiring only a fewer number of logic gates as compared to a standard erasure decoder implementation that has to account for cases where P≠E.

Continuing the example, when analyzing candidate correction masks to select a best fit according to a shortest burst error (e.g., for a SerDes receiver), selection circuitry 110 may be configured to identify, in the 20-bit (four 5-bit symbols) correction mask for each candidate correction mask, a first bit to be flipped and a last bit to be flipped, and determine a difference (in bits) between the positions of both such bits. That difference may be used as a measure of burst error length. The burst error lengths for the candidate correction masks may be compared, and the shortest burst error length selected responsive to the comparison.

In one or more embodiments, decoder 100 may be configured to correct input transmission block 102 responsive to burst candidate correction 112, and output a corrected transmission block 122.

In other embodiments, decode selection logic 118 may be configured to receive burst candidate correction 112 and standard candidate correction 116, which is output by standard RS decoder 114, select one of the burst candidate correction 112 and standard candidate correction 116 (in this example, a 2 random symbol correction mask), and output a selected correction mask. Error correction circuitry 120 may be configured correct input transmission block 102 responsive to a selected correction mask, and output corrected transmission block 122 responsive to the selected candidate correction. For example, error correction circuitry 120 may be configured to XOR selected correction mask with the input transmission block 102 to obtain corrected transmission block 122. Notably, a selected correction mask includes masks and location information, in other words, by defining which bits to apply erasure decoding, the selected correction mask implicitly indicates error locations.

By way of explanation, in some contemplated transmission scenarios, instead of one burst error, input transmission block 102 may include two or more independent "partial" burst errors, which also may be characterized as "single symbol" burst errors. A partial burst error occurs when there are a small number of contiguous bits in error in a symbol. For example, in an 8-bit symbol used with RS-FEC, a burst error event of 1 to 5 bit errors in length that is restricted to a single symbol.

Two burst error events (partial or not) are independent when a second (in transmission order) partial burst error is not caused by a first (in transmission order) partial burst error. Since a partial burst error may be shorter, in bit length, than a symbol, and since the two partial burst errors are independent, burst error decoder 104 may not generate a candidate correction 108 that actually corrects two partial burst error in input transmission block 102. In other words, two small independent error events occurred that each damaged only one RS symbol.

In some embodiments, burst error decoder 104 may be configured to analyze candidate corrections at a sufficient granularity to identify partial burst errors that occur in a given transmission scenario. In other embodiments, decoder 100 may include standard RS decoder 114, which is configured to use some parity symbols to locate errored symbols having partial burst errors and use the rest of the parity symbols to correct those errored symbols. In one or more embodiments of decoder 100, standard RS decoder 114 and burst error decoder 104 may operate in parallel, concurrently, or independent of.

Decode selection logic 118 may be configured to select between burst candidate correction 112 provided by selection circuitry 110, and standard candidate correction 116 provided by standard RS decoder 114. For example, if candidate corrections 108 are correction masks and standard candidate correction 116 is a correction mask, corrected transmission block 122 may be generated by XOR'ing a data portion of input transmission block 102 with a correction mask corresponding to the selected burst candidate correction 112 or standard candidate correction 116. For example, a binary 1 in a correction mask results in a bit correction at the output of the decoder 100 while a binary 0 in a correction mask would result in leaving an input (and thus an output) unchanged.

In one or more embodiments, corrected transmission block 122 may include one or more parity symbols and user symbols, or just user symbols.

Figure 2A:
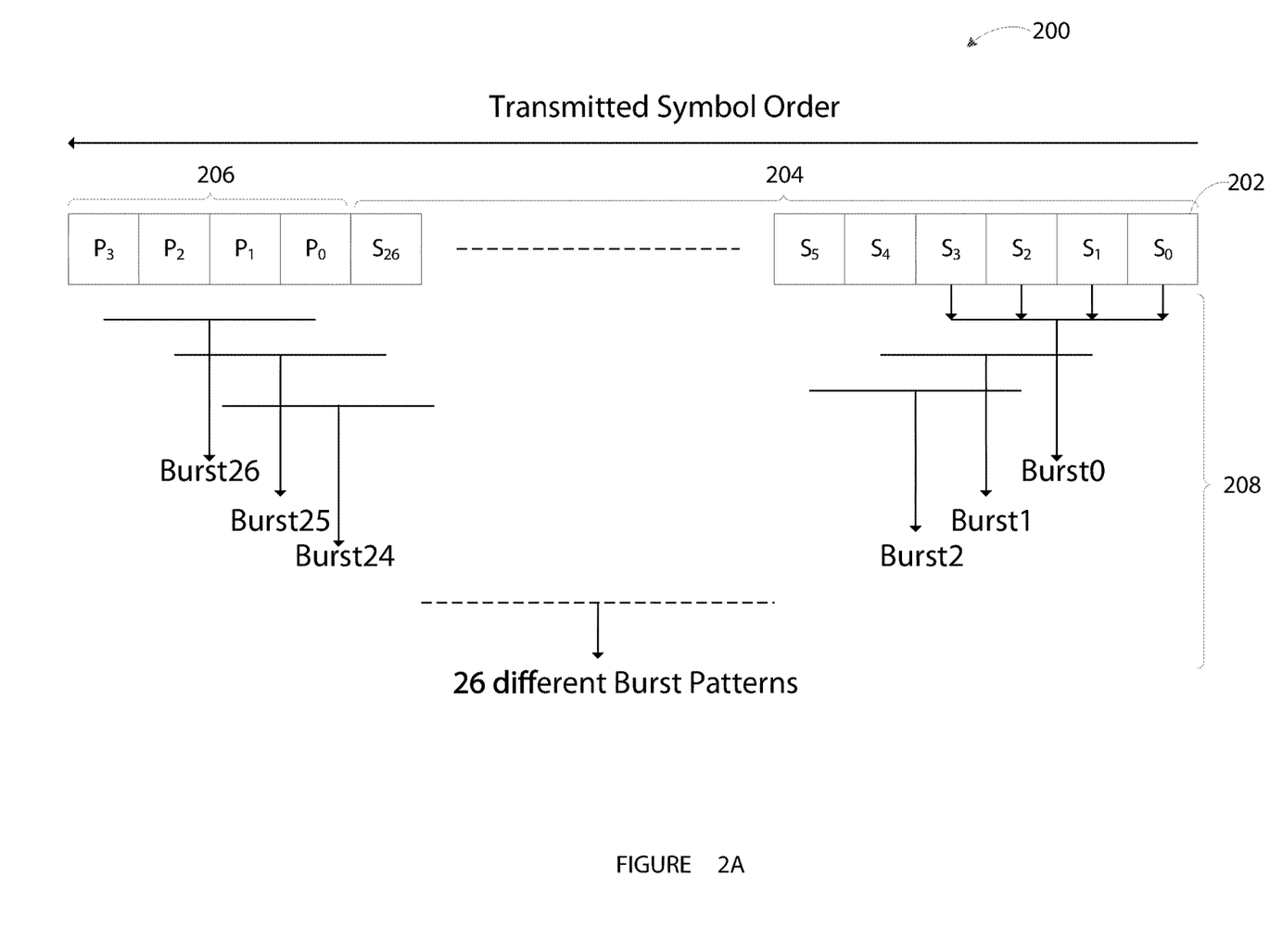
FIG. 2A shows a block diagram of a burst error decoding operation, in accordance with one or more embodiments of the disclosure.

FIG. 2A shows a diagram of an example process 200 for testing burst-error corrections on a transmission block, in accordance with one or more embodiments of the disclosure. As contemplated in the example shown in FIG. 2A, process 200 includes performing erasures using candidate correction patterns 208, which are candidate erasure patterns $Burst_0$-$Burst_{26}$. Each correction pattern 208 comprises some number of the symbols 204 in transmission block 202 that are assumed to be error symbols and that will be erased (and subsequently corrected). In one embodiment, a number of erased symbols in a candidate correction pattern 208 is equal to a number of parity symbols in a transmission block—in this example, transmission block 202 includes four parity symbols 206 ($P_0$, $P_1$, $P_2$ and $P_3$) and so each candidate correction pattern 208 erases four contiguous symbols.

In one or more embodiments, a sequence of erased symbols may be used for candidate correction patterns 208 that fits a transmission scheme and an error profile. For example, since burst errors (and partial burst errors) caused by DFE will affect contiguous bits and symbols, the erased symbols in each candidate correction pattern 208 are contiguous (i.e., immediately adjacent to each other in symbol location of the transmission block 202). Other numbers of parity symbols and erased symbols and arrangements thereof than those described in FIGS. 2A and 2B may be used that fit a particular transmission scheme and/or error profile of interest.

So, for the example shown in FIG. 2A, $Burst_0$ candidate correction pattern assumes $S_0$, $S_1$, $S_2$, and $S_3$ have errors, $Burst_1$ candidate correction pattern assumes $S_1$, $S_2$, $S_3$, and $S_4$ have errors, $Burst_2$ candidate correction pattern assumes $S_2$, $S_3$, $S_4$, and $S_5$ have errors, and so on, with $Burst_{26}$ candidate correction pattern assuming $P_0$, $P_1$, $P_2$, and $P_3$ have errors.

Figure 2B:
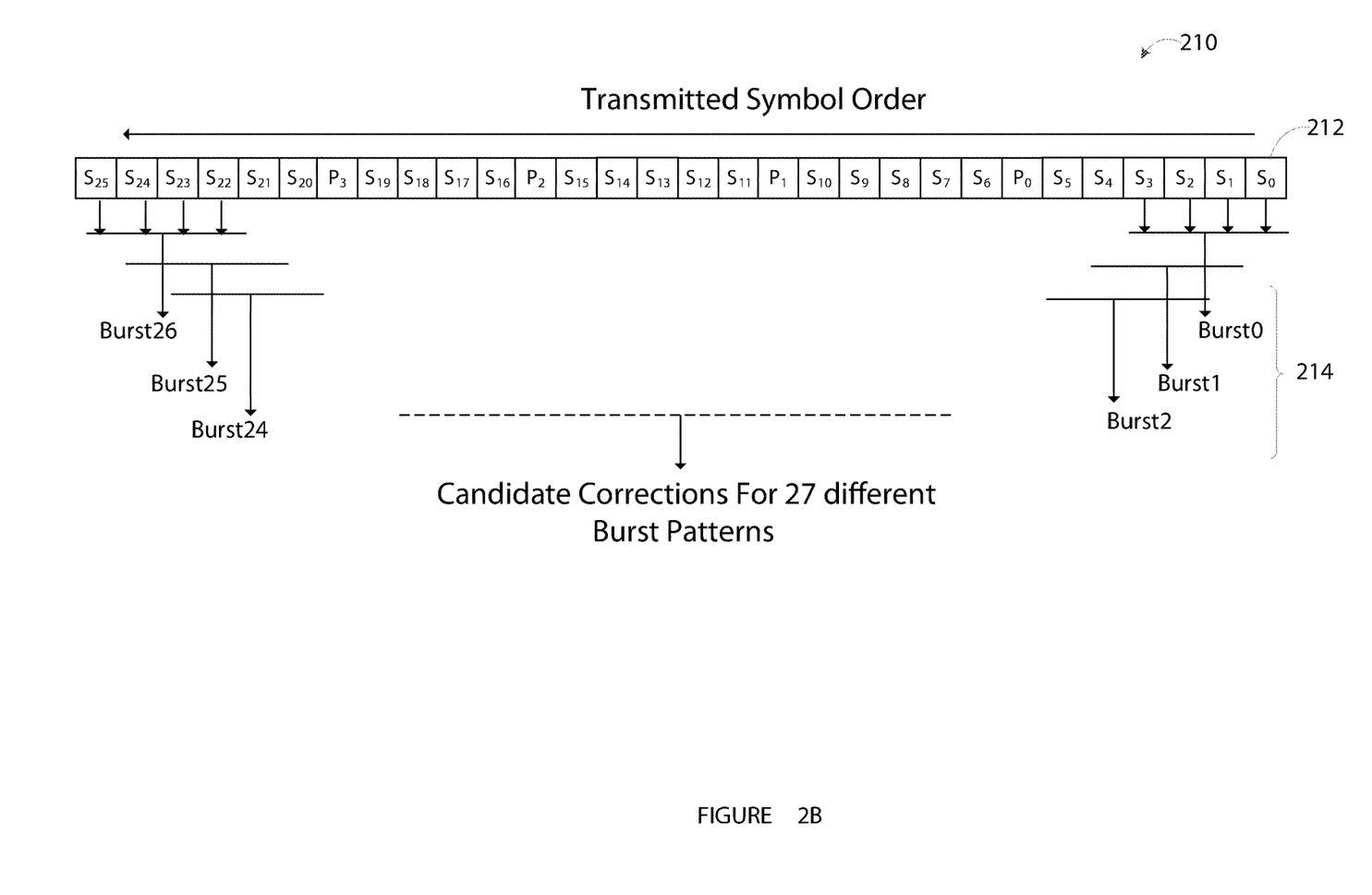
FIG. 2B shows a block diagram of a burst error decoding operation, in accordance with one or more embodiments of the disclosure.

FIG. 2B shows a diagram of an example process 210 for a burst error decode operation of a transmission block 212 using candidate correction patterns 214, in accordance with one or more embodiments. In the example shown in FIG. 2B, parity symbols $P_0$ to $P_3$ are inter-mixed with user symbols $S_0$ to $S_{25}$ in transmission block 212 as compared to transmission block 202 of FIG. 2A where the parity symbols are contiguous. In one or more embodiments, parity symbol position may be selected for any of a number of reasons and may vary from what is shown in FIGS. 2A and 2B. For example, in the example shown in FIG. 2B, the locations of parity symbols $P_0$, $P_1$, $P_2$, and $P_3$ in transmission block 212 are based on the SAS 4 protocol, and more specifically, to address base-line wander within receivers. This disclosure is not limited to a particular location or location scheme for parity symbols in transmission blocks.

Figure 3A:
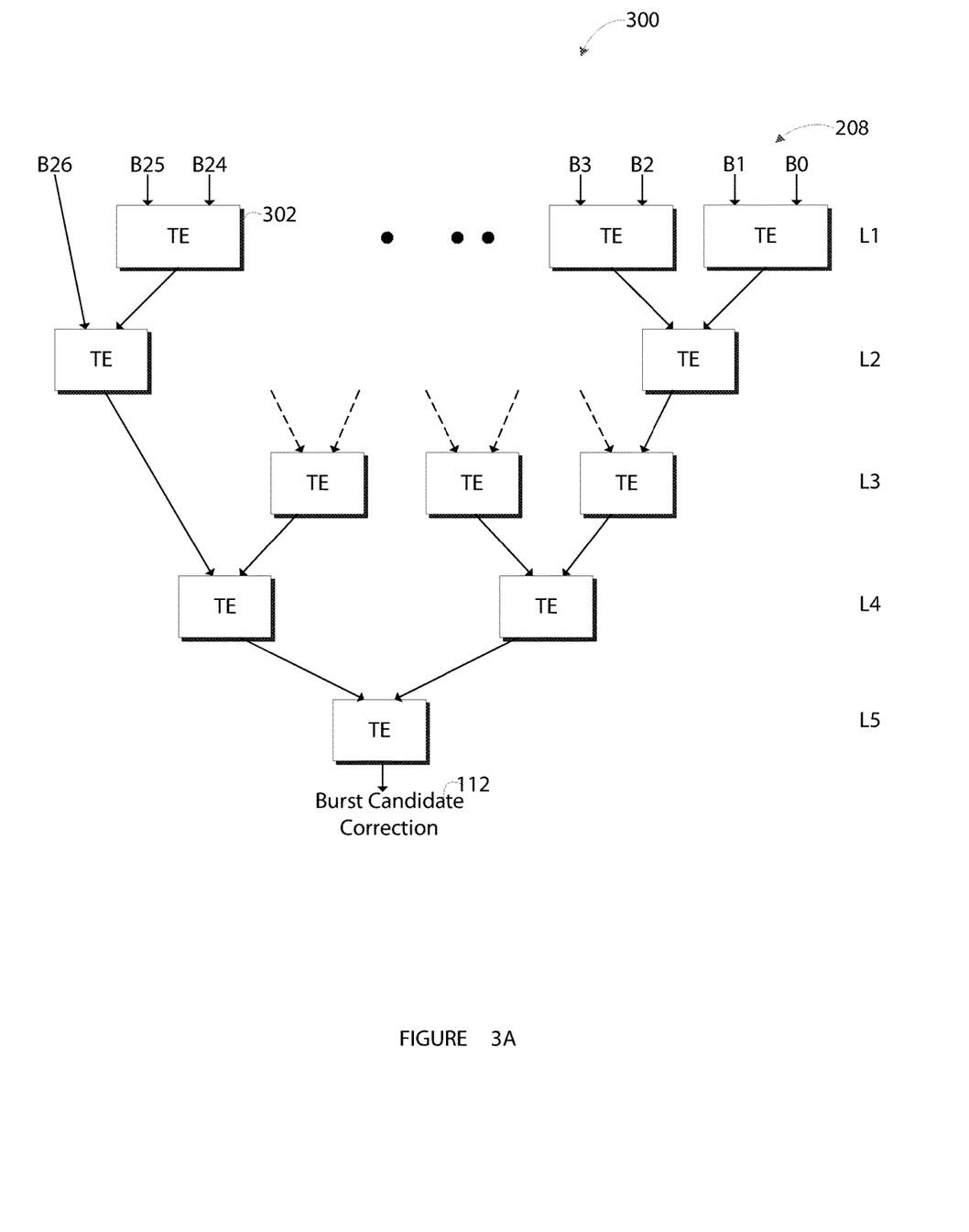
FIG. 3A shows a decision tree to select among candidate corrections, in accordance with one more embodiments of the disclosure.

FIG. 3A is a diagram of a decision tree 300 for a candidate correction selection process for selecting among candidate correction patterns 208, in accordance with one or more embodiments of the disclosure. For example, turning back to FIG. 1, for selection circuitry 110 to select burst candidate correction 112 from among candidate corrections 108, a shortest burst error length corrected by the burst decoder modules 106 is identified. Using an exemplary case, a best score is identified among 27 possibilities using decision tree 300. FIG. 3A shows a full binary layout of decision tree 300, where L1 to L5 represent 5 levels of binary sorting. In this example, decision tree 300 sorts scores for candidate correction patterns 208 two at a time in a tree element 302, with a candidate correction having a lowest score being selected at each stage, and passed through to the next stage.

In one embodiment, sorting is performed in parallel with results from previous levels passed to tree sorting elements 310 (see FIG. 3B) of tree elements 302 of the next level until a lowest score is found, the lowest score corresponding to burst candidate correction 112. In one or more embodiments, a final output from the tree may be a score, error location information, and/or a best candidate correction (e.g., a binary correction mask). One of ordinary skill in the art will understand that any of a number of suitable sorting processes may be used, including merge sorting, selection sorting, insertion sorting, exchange sorting, and combinations thereof.

Figure 3B:
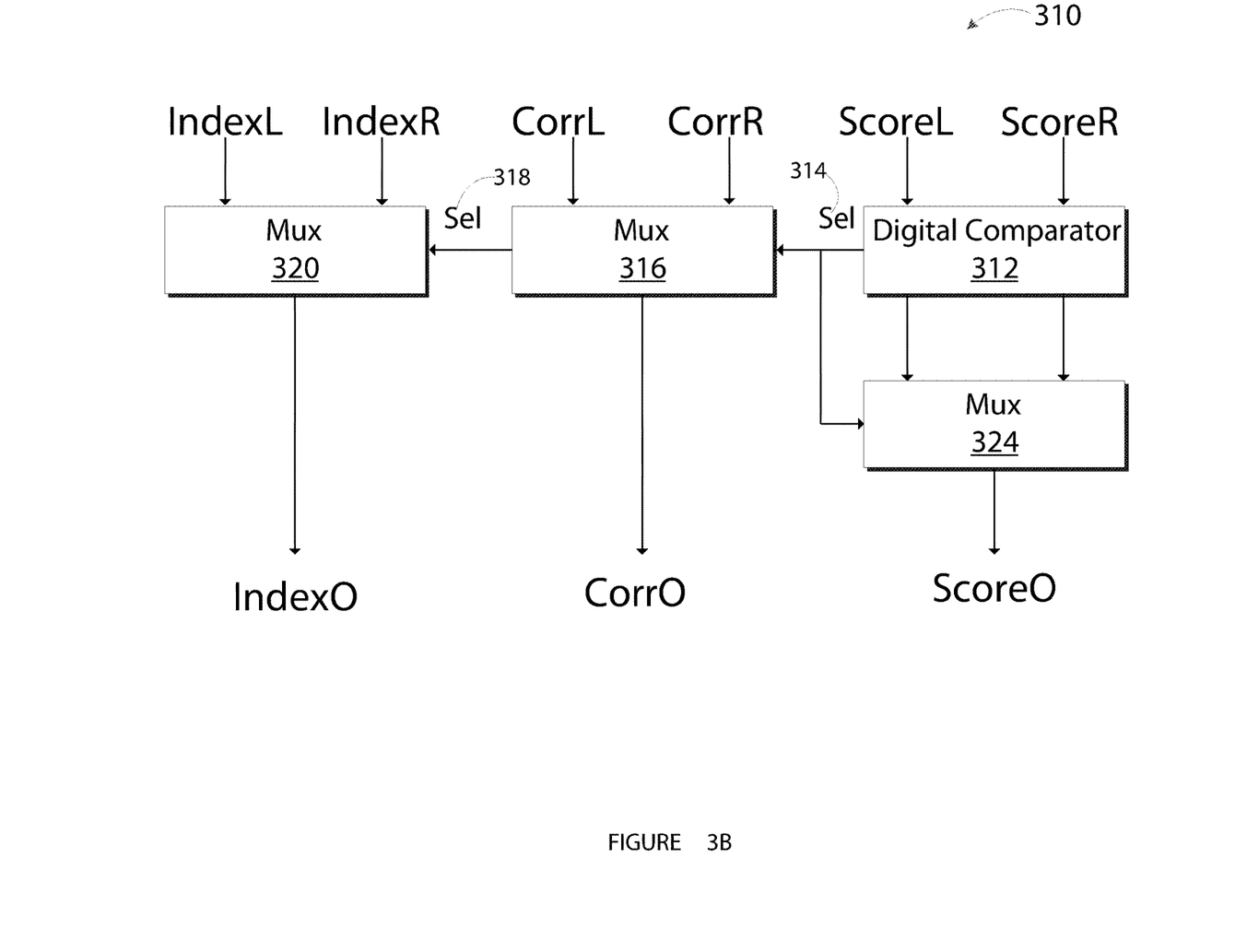
FIG. 3B shows a block-diagram of a sorting element in a decision tree of FIG. 3A, in accordance with one or more embodiments of the disclosure.

FIG. 3B shows a tree sorting element 310 configured to decide between candidate corrections according to comparison criteria, in accordance with one or more embodiments. In one or more embodiments, a tree sorting element 310 may include a digital comparator 312, a multiplexer (MUX) 316, a MUX 320, and a MUX 324. Digital comparator 312 may configured to compare to digital values, here, scores for two candidate corrections ScoreL and ScoreR, and output a selection signal SEL 314 responsive to a comparison result, i.e., which score is lesser or greater, as configured. MUX 316 may be configured to receive two candidate corrections, CorrL and CorrR, and output one of the two candidate corrections responsive to selection signal SEL 314 provided by digital comparator 312. MUX 320 may be configured to receive two index reference values, IndexL and IndexR, and output one of the two index reference values responsive to a selection signal SEL 318 provided by MUX 316 or digital comparator 312. In one or more embodiments, IndexL and IndexR provide location information for where to apply a correction, for example, providing starting symbol numbers for a given correction mask. MUX 324 may be configured to receive the two scores, ScoreL and ScoreR, and output one of the two scores responsive to selection signal SEL 314. The outputs of the various elements described above, IndexO, CorrO, and Score( ) may be provided as inputs to a next tree sorting element or, if all candidate corrections have been compared, output as a burst candidate correction (e.g., the best candidate correction according to the used comparison criteria). The tree sorting element 310 uses the score(s) to select a winner within each tree element (TE) 302. The selected output incudes an index, a score and a candidate correction. The indexes, corrections, and scores are referred to herein as left and right or "L" and "R" merely for sake of convenience and other conventions may be used.

In one or more embodiments, selecting between the standard candidate correction 116 and the burst candidate correction 112 is performed by calculating a score for the standard candidate correction 116 and then comparing this standard score against the score associated with burst candidate correction 112 and selecting the lowest score to determine the final decoder output by decode selection logic 118.

Example conditions for embodiments of selecting between a standard decoder method and a burst decoder result method are presented below in Table 2. If a standard decoder fails to decode and indicates that it cannot perform a decode operation then a burst error decoder output is selected as a decode method, i.e., the best burst-error decoder correction mask is selected as the correction mask for a current FEC block. If the standard decoder reports that only a single error symbol was corrected then the standard decoder is selected. If a standard decoder reports that it has corrected 2 error symbols then a decoder selection is performed by comparing scores for the two methods. For a burst decoder a score may be simply a length of a proposed burst-error correction solution. A score for a standard decoder may be determined by computing a burst-length for each symbol correction, looking up score values for each burst length (e.g., a look-up-table that returns predetermined scores responsive to burst lengths—actual or interpolated) and then summing the two scores together to obtain a total standard decoder score.

TABLE 1

Decoder method selection.

| Standard FEC Fail | Number of standard Symbol Corrections | Relative Score | Selected Decode Method |
|---|---|---|---|
| Fail | X | X | Burst Decoder |
| Pass | 1 | X | Standard Decoder |
| Pass | 2 | Standard < Burst | Standard Decoder |
| Pass | 2 | Standard >= Burst | Burst Decoder |

In one or more embodiments, three constants may be used to help determine a score for a standard decoder output, i.e., standard candidate correction 116, one for single bit error symbol corrections (S1), one for 2-bit error correction symbols (S2) and another for symbol corrections of greater than 2 bits (Sn). Example settings for S0, S1 and Sn are S0=2, S1=4 and Sn=8 although these values can be made configurable through register values in any implementation allowing fine-tuning based on operation in the field when operating with a SerDes receiver. In one or more embodiments, the values for S0 to Sn may be chosen to represent a relative likelihood that a standard decoder correction mask is superior to a burst-error decoder, for example based on a profile of DFE burst errors. More specifically, such DFE burst errors often make a single bit error or a 2-bit error event, so longer bursts become progressively less likely. So a two single bit correction mask from the standard decoder may be given a low score, a two double-bit correction may be given a moderate score and anything else may be given a poor score (two independent error events each of 3 bits and still each fitting within a single RS symbol is not a good correction candidate). The given score is compared against a burst-length of burst decoder output to determine the best candidate.

An example of mapping of correction symbols to a selection of score values for a standard decoder is given in table 2.

TABLE 2

Score selection table

| Correction Mask (binary 5-bit Symbol) | Score constant |
|---|---|
| 00001 | S1 |
| 00010 | S1 |
| 00100 | S1 |
| 01000 | S1 |
| 10000 | S1 |
| 00011 | S2 |
| 00110 | S2 |
| 01100 | S2 |
| 11000 | S2 |
| Others | Sn |

In one or more embodiments, a limit may be placed on a burst decoder supported burst length so that very long burst corrections are blocked from performing corrections and instead indicate decode failure. For example, in a case of SAS 4 a limit may be set to burst length=12 so that any burst decoder output longer than 12 bits would be flagged as a decode failure.

Figure 4:
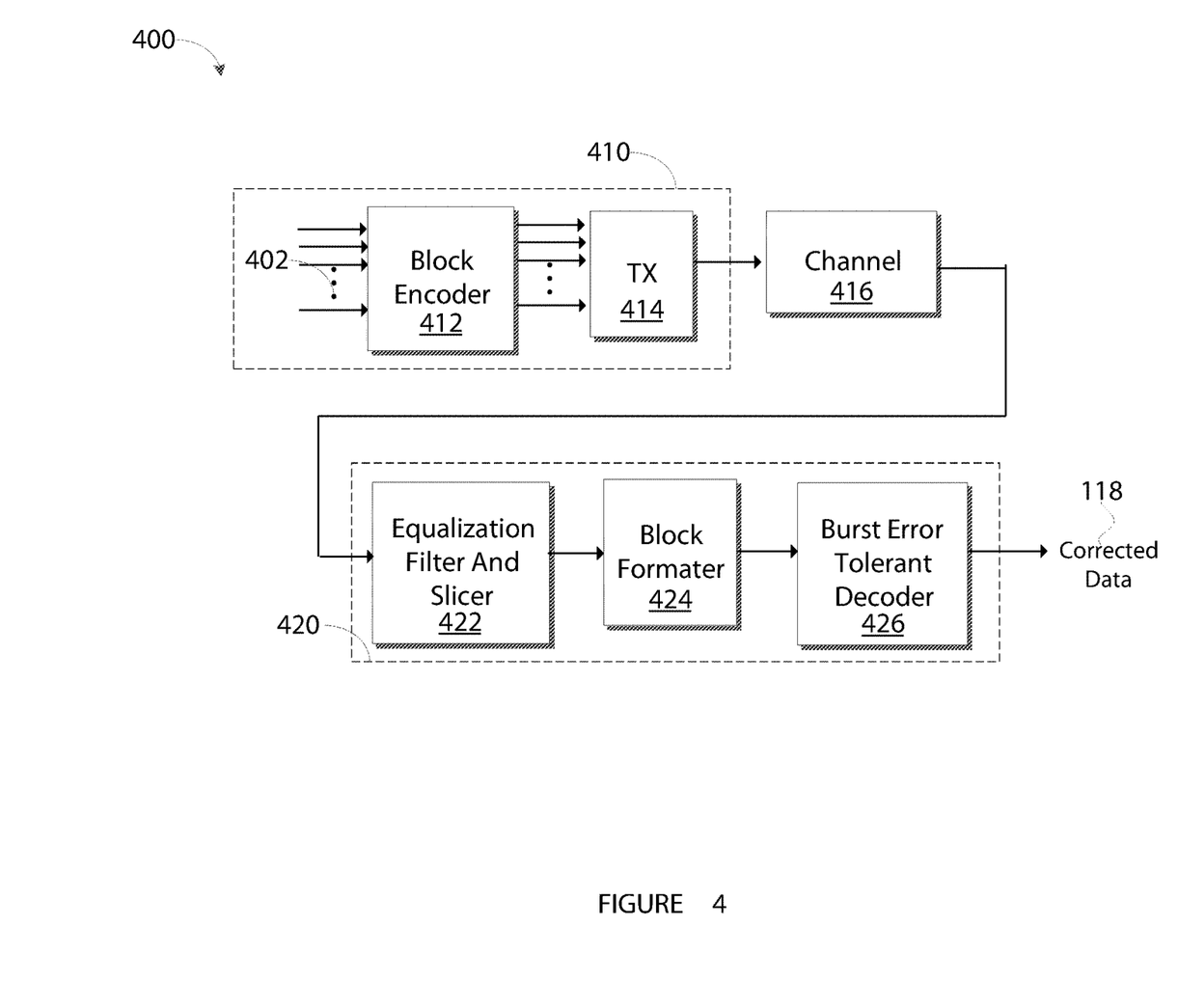
FIG. 4 shows a SerDes Interface that implements at least one decoder with burst-error tolerance, in accordance with one or more embodiments of the disclosure.

One or more embodiments relate to SerDes interfaces (and/or SerDes receivers) that incorporate burst-error tolerant decoders according to one or more embodiments of the disclosure. FIG. 4 shows a block-diagram of an example SerDes interface 400, in accordance with one or more embodiments of the disclosure. SerDes interface 400 may be, for example, a SerDes transmission system. In one or more embodiments, SerDes interface 400 includes a transmitter stage 410, a receiver stage 420, and a channel 416 operatively coupled therebetween. In one or more embodiments, transmitter stage 410 includes block encoder 412 and transmitter (TX) 414.

Block encoder 412 is configured, generally, to block encode a data transmission, for example, using a block encoding technique such as RS. TX 414 is configured, generally, to "serialize" block encoded bits of information received over parallel interface 402 (i.e., take a parallel bus of input bits and serially drive them onto the physical transmission medium of channel 416 such as a physical wire, a "differential pair" of wires, fiber-optic line, and electrical cables, without limitation), and provide a serial stream of data to channel 416. While not shown, other transmitter functions may also be included in transmitter stage 410, such as transmitter emphasis (e.g., a 3-tap FIR filter that weights 3 sequential bits together with configurable weight values to obtain the desired transmit voltage), and transmit scaling (e.g., ±scaling voltage is added to drive the transmission medium at a selected voltage).

Channel 416 is the physical medium for conveying the serial stream of data to receiver stage 420. In one or more embodiments, receiver stage 420 includes equalization filter and slicer 422, block formatter 424, and burst error tolerant decoder 426. Equalization filter and slicer 422 is configured to perform decision based ISI cancellation on the received transmission and then "slices" the transmission signal into 1s and 0s (which are fed back into the equalizer to correct the next bit), as described above in relation to DFE correction. Block formatter 424 is configured to chunk the 1's and 0's of the transmission into transmission blocks according to the convention used by block encoder 412. Burst error tolerant decoder 426 is configured to perform error correction in accordance with one or more embodiments of the disclosure, including, for example, implementing burst error decoders described herein.

One or more embodiments of the disclosure relate, generally, to communication systems that implement one or more transmission scheme interfaces such as SerDes interface 400, and inter-system communication that implements burst error decoding described herein.

Figure 5:
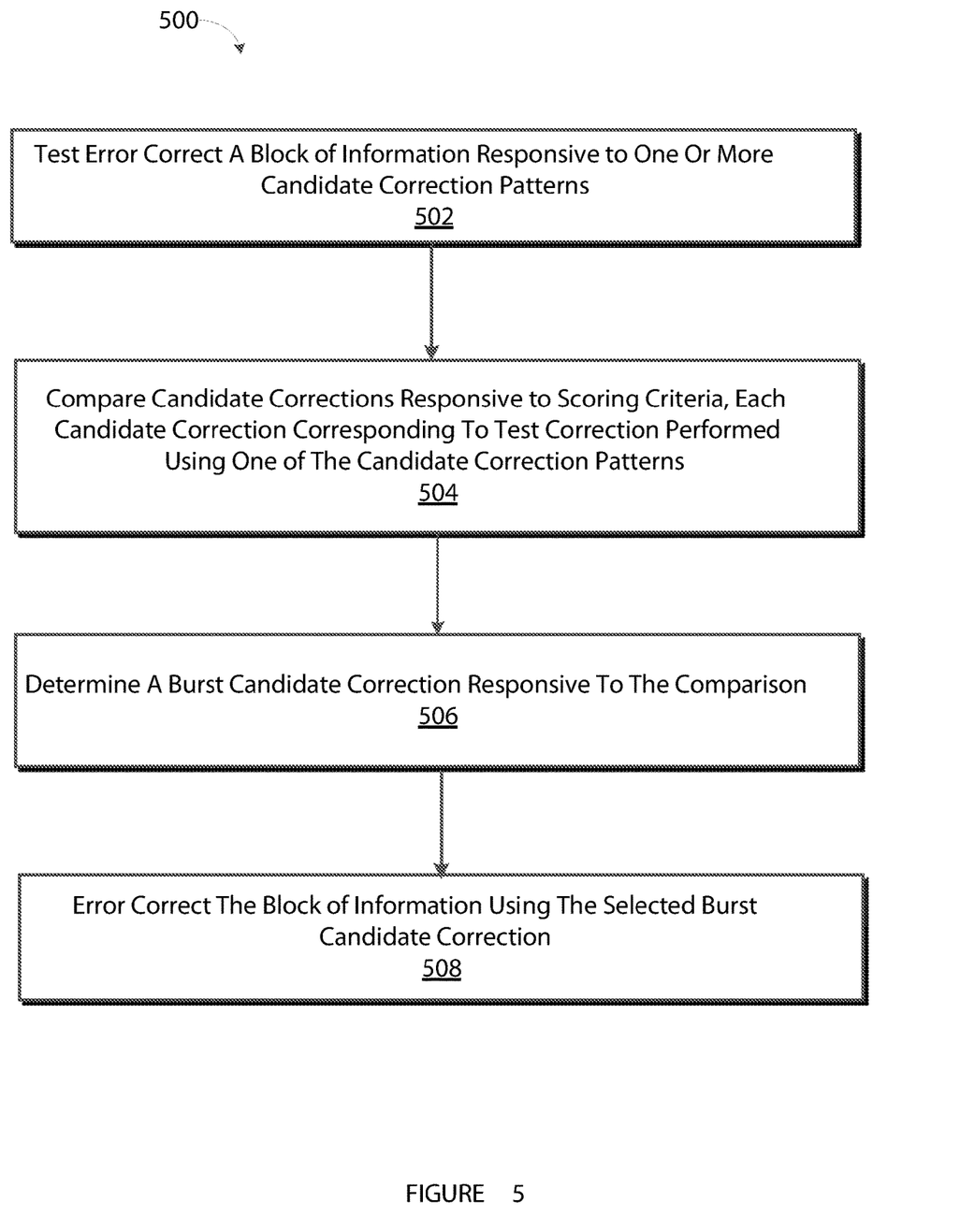
FIG. 5 shows a flowchart of an example error correction processing, in accordance with one or more embodiments of the disclosure.

FIG. 5 shows a flowchart of a process 500 for burst error correction, according to one or more embodiments of the disclosure. In step 502, a received block of transmitted information is test error corrected using one or more candidate correction patterns. In one embodiment, the received block of transmission information may be FEC encoded. The one or more candidate correction patterns may be erasure patterns, that is, a number of contiguous symbols or bits of the received block having a known starting location and an ending location within the received block. In step 504, candidate corrections output responsive to the test error correcting of step 502 are compared according to scoring criteria. Each candidate correction may correspond to one of the candidate correction patterns used for the test error correcting. In one embodiment, candidate corrections may be bit masks using some predetermined convention to indicate bits to be flipped within the received block and bits to remain the same (e.g., '1' indicates a flip, '0' indicates remain the same). In step 506, a burst candidate correction is determined responsive to the comparison of the candidate corrections of step 504. In one embodiment, burst error lengths calculated according to one or more embodiments this disclosure for the candidate corrections may be compared and a comparison criteria (e.g., select the smaller burst error length) may be used to select the burst candidate correction. In step 508, the received block of transmitted information is error corrected using the selected burst candidate correction. The corrected block of transmitted information may be output, provided to another functional block for further processing, or another.

While a single duplex operation may be described in connection with one or more embodiments, the disclosure is not so limited. In one or more embodiments, SerDes interfaces may implement full-duplex operation (e.g., data conversion takes place in both directions at the same time), and may switch between single and full duplex operation.

While SerDes interfaces may have been described for converting from parallel transmission, to serial transmission, and back to parallel transmission, the disclosure is not so limited. Embodiments of burst decoders described herein and related decoding techniques may be used in interfaces for converting from serial transmission to parallel transmission, and back to serial transmission. Embodiments of burst decoders described herein and related decoding and error correction techniques may also be used in interfaces for converting from parallel transmission to a higher/lower bandwidth and back. Embodiments of burst decoders described herein and related decoding and error correction techniques may also be used in interfaces between purely serial channels.

Moreover, this disclosure is not limited to SerDes interfaces. Burst decoders and related decoding and error correction techniques may be used in other transmission scheme interfaces, including those that heretofore have commonly accepted burst errors as unavoidable.

Those of ordinary skill in the art will appreciate many advantages and benefits from the embodiments of this disclosure. For example, higher error tolerance, support for longer transmission links, and more robust operation. Further, since decoders in accordance with embodiments of the disclosure may correct more errors than conventional decoders, design constraints on a SerDes interface may be eased because mistakes may be corrected. By way of example, design constraints may include a length of a transmission medium, materials used for transmission mediums, shielding from foreign noise, and the like.

Another advantage of embodiments of burst error correction techniques of this disclosure is that they may be implemented in conjunction with other error correction techniques, such as a standard error correction technique (e.g., a technique specified in a standard).

Those of ordinary skill in the art will appreciate that the burst error decoding techniques and burst error decoders have wide applications in addition to those described herein. For example, burst error decoders described in this disclosure may be implemented in storage applications, for example, interfaces implemented in point-to-point serial protocols such as serial attached SCSI (e.g., SAS 1, 2, 3, and 4) that move data to and from computer storage elements such as hard-drives, tape drives, and solid-state drives; serial ATA which is a computer bus interface that connects host bus adapters to mass storage devices such as hard-drives, solid state drives, and tape drives; and PCI and PCI express which is an interface for separate serial links connecting devices to a host. Moreover, burst error decoders described in this disclosure may be implemented in network switches (e.g., Ethernet switches), wireless routers, fiber optical communication switches, and more.

The features of the various embodiments described herein are not mutually exclusive and can exist in various combinations and permutations, even if such combinations or permutations are not expressly described herein, without departing from the scope of the disclosure. In fact, variations, modifications, and other implementations of what is described herein will occur to one of ordinary skill in the art without departing from the scope of the disclosure. As such, the invention is not to be defined only by the preceding illustrative description, but only by the claims which follow, and legal equivalents thereof.

Additional non-limiting embodiments of the disclosure include:

Embodiment 1: A decoder configured to perform error correction to a block of information including user symbols and at least one parity symbol, the decoder comprising: a first error correcting circuitry configured to output candidate corrections responsive to test error correcting a block of information using respective candidate correction patterns; a selection circuitry configured to select a burst candidate correction from among the candidate corrections; and a second error correcting circuitry configured to error correct the block of information responsive to the selected burst candidate correction.

Embodiment 2: The decoder of Embodiment 1, wherein the first error correcting circuitry is configured to test error correct the block of information responsive to the candidate correction patterns by: outputting a first candidate correction responsive to first test error correcting the block of information using a first candidate correction pattern of the candidate correction patterns; and outputting a second candidate correction responsive to second test error correcting the block of information using a second candidate correction pattern of the candidate correction patterns.

Embodiment 3: The decoder of any of Embodiments 1 and 2, wherein the selection circuitry is configured to select the burst candidate correction from among the candidate corrections by: comparing error lengths of the candidate corrections; and selecting a candidate correction corresponding to a shortest error length to obtain the burst candidate correction.

Embodiment 4: The decoder of any of Embodiments 1 through 3, wherein, for a given candidate correction, the selection circuitry is configured to: identify in the block of information a first bit to be corrected and a second bit to be corrected in accordance with the given candidate corrections; and determine a distance in bits between the first bit to be corrected and the second bit to be corrected.

Embodiment 5: The decoder of any of Embodiments 1 through 4, wherein the second error correcting circuitry is configured to error correct the block of information responsive to the selected burst candidate correction by: error correcting the block of information responsive to the selected burst candidate correction.

Embodiment 6: The decoder of any of Embodiments 1 through 5, wherein the first error correcting circuitry is configured to test error correct the block of information responsive to the candidate correction patterns by: test error correcting the block of information responsive to one or more candidate erasure patterns, wherein the one or more candidate erasure patterns are contiguous.

Embodiment 7: The decoder of any of Embodiments 1 through 6, wherein the second error correcting circuitry is configured to error correct the block of information responsive to the one or more candidate erasure patterns by: erasing and decoding one or more bits or symbols of the block of information using a correction mask corresponding to the selected burst candidate correction, wherein a correction mask of the one or more correction masks has: a length equal to a number of parity symbols associated with the block of information, or a length equal to a number of bits of parity symbols associated with the block of information.

Embodiment 8: The decoder of any of Embodiments 1 through 7, wherein the first error correcting circuitry is configured to test error correct the block of information responsive to the one or more candidate erasure patterns by: computing one or more symbol erasure decodes responsive to the one or more candidate erasure patterns.

Embodiment 9: The decoder of any of Embodiments 1 through 8, further comprising standard error correction circuitry configured to output a standard candidate correction responsive to standard error correcting the block of information using a standard error correction protocol.

Embodiment 10: The decoder of any of Embodiments 1 through 9, wherein the selection circuitry is configured to select one of the standard candidate correction and the burst candidate correction.

Embodiment 11: The decoder of any of Embodiments 1 through 10, wherein the second error correction circuitry is configured to error correct the block of information responsive to the selected candidate correction by: error correcting the block of information responsive to the selected one of the standard candidate correction and the burst candidate correction.

Embodiment 12: The decoder of any of Embodiments 1 through 11, wherein the selection circuitry is configured to select one of the standard candidate correction and the burst candidate correction by: selecting the burst candidate correction responsive to a result of standard error correcting the block of information being indicative of a failure to decode or error correct the block of information; selecting the standard candidate correction responsive to the result of the standard error correcting the block of information being indicative of only a single error symbol corrected or correctable; selecting the burst candidate correction responsive to the result of standard error correcting the block of information being indicative of two or more error symbols being corrected or correctable and a score of the burst candidate correction being greater than or equal to a score of a standard decoder; and selecting the standard candidate correction responsive to the result of standard error correcting the block of information being indicative of two or more error symbols being corrected or correctable and the score of the standard candidate correction being greater than the score of the standard decoder.

Embodiment 13: The decoder of any of Embodiments 1 through 12, wherein the selection circuitry is configured to: determine the score of the burst candidate correction responsive to a length of the burst candidate correction; and determine the score of the standard candidate correction by: determining one or more standard candidate lengths, each of the one or more standard candidate lengths corresponding to a symbol correction of the standard candidate correction; identifying scores associated with the one or more standard candidate lengths responsive to a look-up-table, wherein the look-up-table comprises score values associated with standard candidate lengths; and determining the score of the standard candidate correction responsive to the identified scores.

Embodiment 14: The decoder of any of Embodiments 1 through 13, wherein the standard error correcting circuitry is configured to standard error correct the block of information by forward error correcting the block of information.

Embodiment 15: The decoder of any of Embodiments 1 through 14, wherein the forward error correcting the block of information comprises performing Reed-Solomon error correction.

Embodiment 16: The decoder of any of Embodiments 1 through 15, wherein the block of information is a forward error correction encoded block of information.

Embodiment 17: A transmission interface that is burst-error tolerant, the transmission interface comprising: a transmitter configured to sequentially provide bits of a forward error correction (FEC) encoded transmission block to a physical transmission line; and a receiver configured to: receive transmitted bits of the FEC encoded transmission block from the physical transmission line; detect bits of the transmitted bits that exhibit characteristics indicative of burst errors induced in the FEC encoded transmission block during transmission over the physical transmission line; and change at least some of the detected bits.

Embodiment 18: The transmission interface of any of Embodiment 17, wherein the receiver comprises a burst error decoder, wherein the burst error decoder is configured to test correction patterns for correcting errors in contiguous bits of the received transmitted bits of the FEC encoded transmission block.

Embodiment 19: The transmission interface of any of Embodiments 17 and 18, wherein the receiver comprises a standard error correction circuitry configured to perform a standard error correction protocol on the received transmitted bits of the FEC encoded transmission block, and wherein the receiver is configured to select one of a result of the standard error correction circuitry and a result of the burst error decoder.

Embodiment 20: The transmission interface of any of Embodiments 17 through 19, wherein the bits indicative of burst errors are indicative of partial burst errors.

Embodiment 21: A method of error correcting a block of information that is forward error correction (FEC) encoded, the method comprising: generating candidate corrections responsive to test error correcting a block of information responsive using candidate correction patterns; selecting a burst candidate correction from among the candidate corrections; and error correcting the block of information responsive to the selected burst candidate correction.

Embodiment 22: The method of any of Embodiment 21, further comprising: generating a first candidate correction responsive to first test error correcting the block of information using a first candidate correction of the candidate corrections; and generating a second candidate correction responsive to second test error correcting the block of information using a second candidate correction of the candidate corrections.

Embodiment 23: The method of any of Embodiments 21 and 22, wherein the selecting the candidate correction of the candidate corrections comprises selecting a burst candidate correction responsive to the first candidate correction and the second candidate correction.

Embodiment 24: The method of any of Embodiments 21 through 23, wherein the selecting the burst candidate correction responsive to the first candidate correction and the second candidate correction comprises selecting one of the first candidate correction and the second candidate correction responsive to comparing a first error length corresponding to the first candidate correction and a second error length corresponding to the second candidate correction.

Embodiment 25: The method of any of Embodiments 21 through 24, wherein the selecting the burst candidate correction responsive to the first candidate correction and the second candidate correction further comprises: determining the first error length or the second error length by: identifying in the block of information a first bit to be corrected and a second bit to be corrected; and determining a distance in bits between the first bit to be corrected and the second bit to be corrected.

Embodiment 26: The method of any of Embodiments 21 through 25, wherein the selecting one of the first candidate correction and the second candidate correction responsive to comparing the first error length corresponding to the first candidate correction and the second error length corresponding to the second candidate correction comprises: selecting the first candidate correction responsive to the first error length being shorter than the second error length; and selecting the second candidate correction responsive to the second error length being shorter than the first error length.

Embodiment 27: The method of any of Embodiments 21 through 26, wherein the test error correcting the block of information responsive to the candidate correction patterns comprises test error correcting the block of information responsive to candidate erasure patterns, wherein the candidate erasure patterns are contiguous within the block of information.

Embodiment 28: The method of any of Embodiments 21 through 27, wherein the error correcting the block of information responsive to the candidate erasure patterns comprises: defining correction masks corresponding to the candidate erasure patterns, wherein a correction mask of the correction masks has a length equal to a number of parity symbols associated with the block of information or bits of parity symbols associated with the block of information.

Embodiment 29: The method of any of Embodiments 21 through 28, wherein the test error correcting the block of information responsive to the candidate erasure patterns comprises computing symbol erasure decodes responsive to the candidate erasure patterns.

Embodiment 30: The method of any of Embodiments 21 through 29, wherein the test error correcting the block of information responsive to the candidate correction patterns further comprises standard error correcting the block of information responsive to a standard error correction protocol.

Embodiment 31: The method of any of Embodiments 21 through 30, wherein the selecting the candidate correction of the candidate corrections comprises selecting one of the standard candidate correction and the burst candidate correction.

Embodiment 32: The method of any of Embodiments 21 through 31, wherein the error correcting the block of information responsive to the selected candidate correction comprises error correcting the block of information responsive to the selected one of the standard candidate correction and the burst candidate correction.

Embodiment 33: The method of any of Embodiments 21 through 32, wherein the selecting one of the standard candidate correction and the burst candidate correction comprises: selecting the burst candidate correction responsive to a result of standard error correcting the block of information being indicative of a failure to decode or error correct the block of information; selecting the standard candidate correction responsive to the result of the standard error correcting the block of information being indicative of only a single error symbol being corrected or correctable; selecting the burst candidate correction responsive to the result of standard error correcting the block of information being indicative of two or more error symbols being corrected or correctable and a score of the burst candidate correction being greater than or equal to a score of the standard decoder; or selecting the standard candidate correction responsive to the result of standard error correcting the block of information being indicative of two or more error symbols being corrected or correctable and the score of the standard candidate correction being greater than the score of the standard decoder.

Embodiment 34: The method of any of Embodiments 21 through 33, wherein the selecting one of the standard candidate correction and the burst candidate correction further comprises: determining the score of the burst candidate correction responsive to a length of the burst candidate correction; and determining the score of the standard candidate correction by: determining lengths, each of the lengths corresponding to a symbol correction of the standard candidate correction; identifying scores associated with the lengths responsive to a look-up-table, wherein the look-up-table comprises score values associated with lengths; and determining the score of the standard candidate correction responsive to the identified scores.

Embodiment 35: The method of any of Embodiments 21 through 34, wherein the standard error correcting the block of information comprises responsive to the standard candidate correction comprises forward error correcting the block of information.

Embodiment 36: The method of any of Embodiments 21 through 35, wherein the forward error correcting the block of information comprises Reed-Solomon error correcting the block of information.

What is claimed is:

1. A transmission interface that is burst-error tolerant, the transmission interface comprising:
 a transmitter to sequentially provide a forward error correction (FEC) encoded transmission block to a physical transmission line; and
 a receiver to:
 receive the FEC encoded transmission block from the physical transmission line;
 detect, via multiple candidate correction patterns, bits of the received FEC encoded transmission block that exhibit characteristics indicative of burst errors induced in the FEC encoded transmission block during transmission over the physical transmission line; and
 change at least some of the detected bits.

2. The transmission interface of claim 1, wherein the receiver comprises a burst error decoder, wherein the burst error decoder tests candidate correction patterns for correcting errors in contiguous bits on the received FEC encoded transmission block.

3. The transmission interface of claim 2, wherein the receiver comprises a standard error correction decoder, wherein the standard error correction decoder applies a standard error correction protocol on the received FEC encoded transmission block, and wherein the receiver selects one of a result of the standard error correction circuitry and a result of the burst error decoder.

4. The transmission interface of claim 3, wherein the burst error decoder:
 applies candidate correction patterns to the received FEC encoded transmission block; and
 selects a candidate correction pattern having a closest determined relationship with a burst error.

5. The transmission interface of claim 4, wherein the burst error decoder:
 determines a score of a respective candidate correction pattern at least partially based on a correction result generated at least partially responsive to application of the respective candidate correction pattern to the received FEC encoded transmission block;
 determines a score of a further respective candidate correction pattern at least partially based on a correction result generated at least partially responsive to application of the further respective candidate correction pattern to the received FEC encoded transmission block; and
 selects a candidate correction pattern from one of the respective candidate correction pattern or the further respective candidate correction pattern.

6. The transmission interface of claim 2, wherein the detected bits of the received FEC encoded transmission block are contiguous bits.

7. A transmission interface that is burst-error tolerant, the transmission interface comprising,
 a transmitter to sequentially provide a forward error correction (FEC) encoded transmission block to a physical transmission line; and
 a receiver to:
 receive the FEC encoded transmission block from the physical transmission line;
 detect, via test candidate correction patterns for correcting errors in contiguous bits on the received FEC encoded transmission block, bits of the received FEC encoded transmission block that exhibit characteristics indicative of partial burst errors induced in the FEC encoded transmission block during transmission over the physical transmission line; and
 change at least some of the detected bits.

* * * * *

UNITED STATES PATENT AND TRADEMARK OFFICE
CERTIFICATE OF CORRECTION

| | |
|---|---|
| PATENT NO. | : 11,831,340 B2 |
| APPLICATION NO. | : 17/453119 |
| DATED | : November 28, 2023 |
| INVENTOR(S) | : Peter Graumann |

It is certified that error appears in the above-identified patent and that said Letters Patent is hereby corrected as shown below:

In the Specification

| | | |
|---|---|---|
| Column 11, | Line 17, | change "and Score() may" to --and ScoreO may-- |
| Column 13, | Line 11, | change "(e.g., ±scaling" to --e.g., ± scaling-- |

In the Claims

| | | | |
|---|---|---|---|
| Claim 7, | Column 20, | Line 26, | change "interface comprising" to --interface comprising:-- |

Signed and Sealed this
Twenty-third Day of April, 2024

*Katherine Kelly Vidal*

Katherine Kelly Vidal
*Director of the United States Patent and Trademark Office*